US008332209B2

(12) United States Patent
Grinblat

(10) Patent No.: US 8,332,209 B2
(45) Date of Patent: Dec. 11, 2012

(54) METHOD AND SYSTEM FOR TEXT COMPRESSION AND DECOMPRESSION

(75) Inventor: Zinovy D. Grinblat, Medford, MA (US)

(73) Assignee: Zinovy D. Grinblat, Medford, MA (US)

( * ) Notice: Subject to any disclaimer, the term of this patent is extended or adjusted under 35 U.S.C. 154(b) by 1014 days.

(21) Appl. No.: 11/789,081

(22) Filed: Apr. 24, 2007

(65) Prior Publication Data

US 2008/0270117 A1   Oct. 30, 2008

(51) Int. Cl.
*G06F 17/21* (2006.01)

(52) U.S. Cl. ............ 704/10; 704/4; 704/7; 704/8; 704/9

(58) Field of Classification Search .................. None
See application file for complete search history.

(56) References Cited

U.S. PATENT DOCUMENTS 5,546,575 A * 8/1996 Potter et al. .......................... 1/1
5,701,459 A * 12/1997 Millett et al. ........................ 1/1
5,913,209 A * 6/1999 Millett ................................. 1/1
2004/0225497 A1* 11/2004 Callahan ....................... 704/235
2005/0198070 A1* 9/2005 Lowry ......................... 707/104.1

* cited by examiner

*Primary Examiner* — Leonard Saint Cyr

(57) ABSTRACT

Creation and recovering of the pseudo-code (Y) form the basis of the present method of text compression and decompression. The pseudo-code includes information of a repeating index/symbol (constant C) and a current index/symbol (X). To service the pseudo-code one needs to convert original symbols of text into indexes and to create a permanent and temporary vocabulary. The present permanent vocabulary is a redundant vocabulary built in advance includes dictionary with common symbols taken from books, articles, and dictionaries, and serves as a reference vocabulary stored in the permanent memory. The temporary vocabulary is built and is used during compression and decompression processes. The functionality of the temporary vocabulary is to convert a high bit length of indexes belonging to the permanent vocabulary into a low bit length indexes present in the temporary vocabulary.

3 Claims, 3 Drawing Sheets

, and the
, and that is to
, and have
, and who
, and in these
, and every
, and from this
, and I have the
, and to
, and he will
, and he could
, and he would
, and with an
, and instead of the
, and made
after our
and is no
, must be
, must not be
me, and I
, but this
, but on
, but I have
, but I had
, but it was not
It is said that
, if not
"What do you
I am not
, from which he
if I were
At her for
We must not
to me by
of whom I
, so I could in which they
in which there
in which that
in which their
in which were
in which was
in which you
on which the
. There was no
. There was
, there was a
. There were
. There is
were not in the
were in the
were in a
were not in a
for it.
for it,
in the same
. It was
, it was
it to be.
, that's what he would
"Yes it is.
at least
that's it.
, so that we
, Besides,
"That is to say,
now many
"Why not?"
was one of the
about it
to be in
. But for now, you , upon the
. "I don't
, so that I
, so that she
, so that he
, so that we
to do in such
, could not
, then,
I am going to
, before which
, like the
, aren't you
, before which
. It is very
all the
if the
on the
of the
"First of all
"Well
"Were is
On the other side
On the first
. Nevertheless,
as if the
are not on
who have
against the
state of
you have to
, as we have
, as I have
, so long as
, so far as , all this
from him the
first of all
"You may
"It's
that it is not
, for instance,
to which I
as he was
under the
to let the
the most
over the
them the
, when the
among the
only the
near the
under the
"well, then, let us
will never
as we have said
as I have said
, without any
, it would be
we are about
to all the
been able to
on that account
and at these
. "There is no
what is to be
. What is to be
, what is to be
the most of the have been
from whom have
from any other
, and it is from her
, and it from him
, and it is from them
for from this
from that,
"That did not
up from the
down from the
At the end of the
At the end of a
"What are you talking about?"
"What does it
"very well
. It would have been
"Do you think it's
There had been
; we will see
; with the
that would be
, I would
though it was by
. In order to be
as if it were
may be as usual
, that a piece of
, or at all
, according to the
into each other
. It was as
. "I'm so glad you
"I was always to
. " There had been a

Fig. 2

METHOD AND SYSTEM FOR TEXT COMPRESSION AND DECOMPRESSION

REFERENCES CITED

[1] D. Huffman, "A Method for the Construction of Minimum Redundancy Codes," in Proc. IRE, vol. 40, no. 9, pp. 1098-1101, 1952.
[2] Gonzalo Navarro and Mathieu Raffinot. A General Practical Approach to Pattern Matching over Ziv-Lempel Compressed Text. *Proc. CPM'99*, LNCS 1645. Pages 14-36, 1999
[3] J. Ziv, A. Lempel, "A universal algorithm for sequential data compression", IEEE Transactions on Information Theory, May 1977, Volume: 23 Issue: 3, pp: 337-343,
[4] J. Ziv and A. Lempel. Compression of individual sequences via variable length coding. IEEE Trans. Inform. Theory, 24:530-536, 1978
[5] U. Khurana "Text compression and Superfast Searching";
[6] Generation Text Retrieval Systems", *IEEE Computer* 33(11):37-44 (cover feature), November 2000

BACKGROUND OF THE INVENTION

1. Field of the Invention

The invention relates to the field of compression and decompression of text.

2. Description of the Prior Art

Compression algorithms, such as Huffman, LZ78, LZW and hundreds of other variants of the above techniques usually exploit statistical redundancy of the English letters and give limited compression rate, which was formulated by Claude E. Shannon. According to the Claude E. Shannon's theory of data compression there is a fundamental limit (entropy rate) to lossless data compression. Shannon has been able to estimate for the general model (by using a prediction method) that the entropy rate of the English text can in theory reach 2.3 bits/character. None of the proposed above compression algorithms can provide results as theorized in the Cannon's third-order statistical distribution of English text entropy rate, with the obtainable limit reaching 2.77 bits/character. There were a lot of techniques proposed to increase the compression rate (absolute number) or compression ratio (relative number), e.g. a word-based Huffman coding, where, the table of symbols in the
compression coder becomes the text vocabulary; or an Efficient Optimal Recompression; or a Semi-lossless Text Compression; or a Programmed selection of common characters and pairs; or a Programmed selection of prefixes and suffixes; or the method of compression text proposed by U. Khurana "Text compression and Superfast Searching;" [[5]] based on sequentially converting words of source text into 16 high bit length indexes. For the method of compression text proposed by U. Khurama it is impossible to increase compression ratio because of limitation up to 65,536 words contained in the permanent reference vocabulary by means limitation to build vocabulary symbols as phrases, punctuations, and words and mark combinations Compression techniques involve trade-offs between various factors, such as the complexity of the designs of data compression/decompression schemes, the ability to search a compressed text in the system without decompressing it, the speed of an operation system, the consumption of expensive resources (i.e. storages and transmission bandwidth), the compression capability, the time it takes to compress information, the user's computer power, the cost of text compression due to the text coding and decoding as well as other factors. None of the methods satisfy the requirement of efficient compression and decompression of text. Furthermore, the methods have both advantages and disadvantages of implementation of different kinds of applications e.g. the requirement of reducing time of text decompression and reducing the working frequency of a microprocessor of an electronic rider.

The present invention tries to resolve some restrictions of the systems and apparatuses, which are involved in the process of coding/decoding, storing, and transmitting of text. Furthermore, the present method of converting any symbols into indexes permits to increase the compression ratio of the stored text, to increase the compression rate of the transmitted text, and to reduce the cost of the receivers.

In the present invention "symbol" means letter, word, phrase, number, sentence, punctuation mark, prefix, suffix, and permanently or temporarily made words combinations; "Index" means an address of the symbol located in the permanent and temporary vocabularies.

SUMMARY OF THE INVENTION

An object of the present invention is to provide the compression and decompression method of converting symbols of text into indexes by means to compressed text and then recovering these indexes back to symbols of text as needed.

Another object of the present invention is to provide the permanent vocabulary. The permanent vocabulary is a redundant vocabulary and it includes dictionary with common symbols taken from thousands of books, and serves as a permanent reference vocabulary. The permanent vocabulary is created in advance of any information processing.

Still another object of the present invention is to provide the temporary vocabulary. The present temporary vocabulary includes repeating and common indexes/symbols (constant C) and indexes/symbols (X). These repeating, common and indexes are kept in two separate parts of the temporary vocabulary, as the root of tree and main storages. The functionality of the temporary vocabulary is to convert high bit length indexes belonging to the permanent vocabulary into low bit length indexes present in the temporary vocabulary, which are then used to create pseudo-codes.

The features and preferences of the present method and system based thereon will be apparent from the following description and from accompanying drawings.

BRIEF DESCRIPTION OF THE DRAWINGS

FIG. 2 illustrates some repeating symbols.

DESCRIPTION OF THE PREFERRED METHOD AND SYSTEM

The present invention provides the method and apparatus, which convert symbols into index, creating the pseudo-code (Y) by formula $Y=C+X$, and recovering the pseudo-code into symbols by formula $X=Y-C$. Where: the pseudo-code includes information of repeating and common (constant C) and (X) indexes/symbols. The apparatus means a computer. The computer includes storage devices, analyzer (processor, memory coupled to a processor, counter and logic scheme); input and display terminals and power supply (not shown).

The present invention provides a computer system. The computer system includes: an apparatus see FIG. 3; storage for storing a permanent reference vocabulary contents; storage for storing a temporary reference vocabulary contents; storage for storing a compressed text contents; storage for non-transitory computer readable media storing the program, wherein the program instructs a processor to perform the method for compression and decompression text.

The present method of text compression needs to build the permanent vocabulary, which, then is served as a reference vocabulary used in different applications. The present permanent vocabulary is a redundant vocabulary, and it includes dictionary with common symbols taken from thousands of books, articles, and serves as a permanent reference vocabulary. This permanent vocabulary is created in advance of any information processing.

Also the present method of text compression and decompression needs to build the temporary vocabulary during information processing. The present temporary vocabulary includes repeating and common indexes/symbols (constant C) and indexes/symbols (X). These repeating, common and current indexes are kept in two separate parts of the temporary vocabulary, as the root of tree and main storages. The functionality of the temporary vocabulary is to convert high bit length indexes belonging to the permanent vocabulary into low bit length indexes present in the temporary vocabulary, which are then used to create pseudo-codes.

Figure 1:
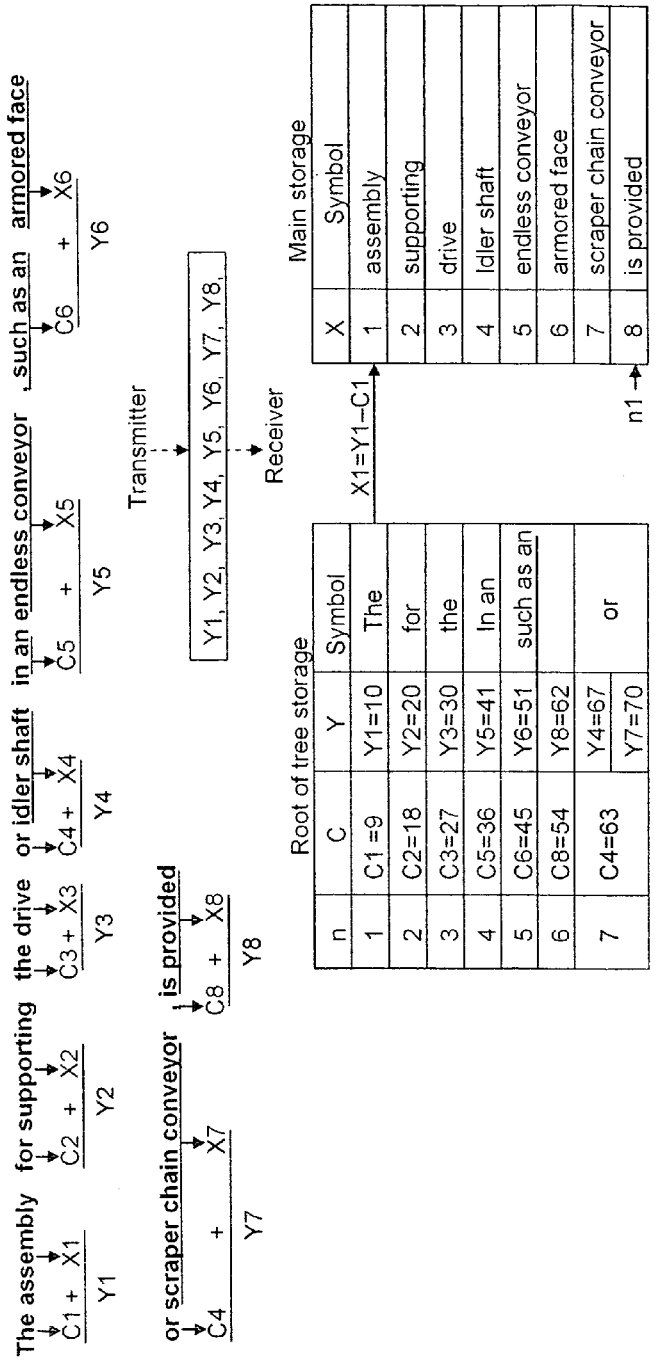
FIG. 1 illustrates the example of the present method of text compression, storage, transmission, and decompression.

The present method of text compression and decompression is illustrated in FIG. 1. Where: Y—pseudo-code; constant C—repeating index (repeating index holds the root of tree storage of temporary vocabulary); X—index (index holds the main storage of temporary vocabulary); the sentence is taken from the U.S. Pat. No. 6,227,354.

In this embodiment the original symbols of a sentence are converted into repeating and current indexes (C1-C6, C8, and X1-X8) and, then, these indexes are converted into pseudo-codes (Y1-Y8) by formula $Y=C+X$. Then the organized pseudo-codes are transmitted, and, then, the pseudo-codes are recovered into indexes/symbols as constant C and X by formula $X=Y-C$ on the receiver side.

FIG. 2 illustrates some common symbols (constant C). In this example only the characters of repeating and common symbols are shown.

According to the present method of text compression/decompression, both the transmitter and the receiver sides have to store a reference permanent vocabulary. The present permanent vocabulary is a statistically and functionality amount of symbols taken from thousands books, articles, and dictionaries. The present permanent vocabulary, for example, may include several sections, such as section 1 with symbols and most common usable words, section 2—nouns, section 3—verbs, section 4—adjective, section 5—numbers, section 6—names, section 7—words represented by summary of group of characters, and section 8—languages. Section 7 is used when words not include in the permanent vocabulary. The length of word index, which not present in the permanent vocabulary, will be summary of each length of indexes of section 7. For example, word "stuttering", which not present in the permanent vocabulary, separated to parts as "stut+ter+ing". The summary of length of its corresponding indexes of separated parts from section 7 will be present word "stuttering". The section 7 includes symbols itself and symbols with spaces. The symbols with spaces permit to recognize words without using special logic or additional command. Section-3 include all dictionary verbs and symbols, for example, as "have saved, has saved, not saved, have been saved, and being saved," etc.

It is understood that exemplary of the permanent vocabulary based on the described herein may be implemented in variety of different application e.g. an electronic rider book, or book on CD, or Internet (internet is used a permanent vocabulary with symbols were taken from thousands books, articles, and professional dictionaries), or for foreigners riders (a permanent vocabulary includes not only a translator but also a definition dictionary).

Figure 3:
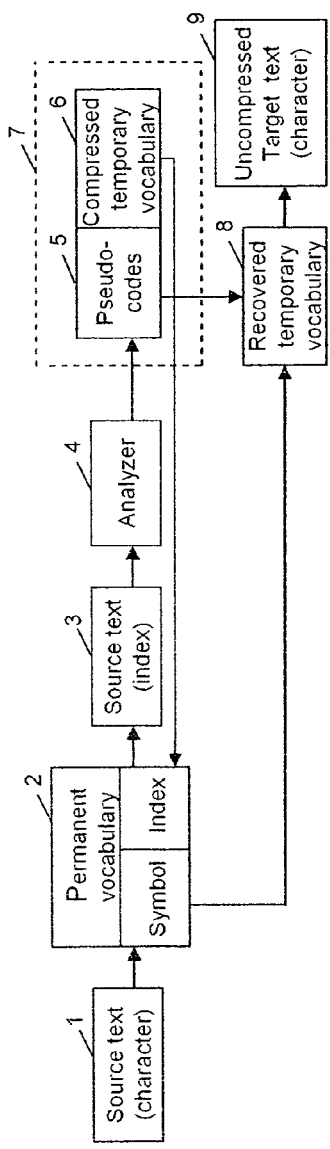
FIG. 3 illustrates flow chart of text compression and decompression.
Figure 4:
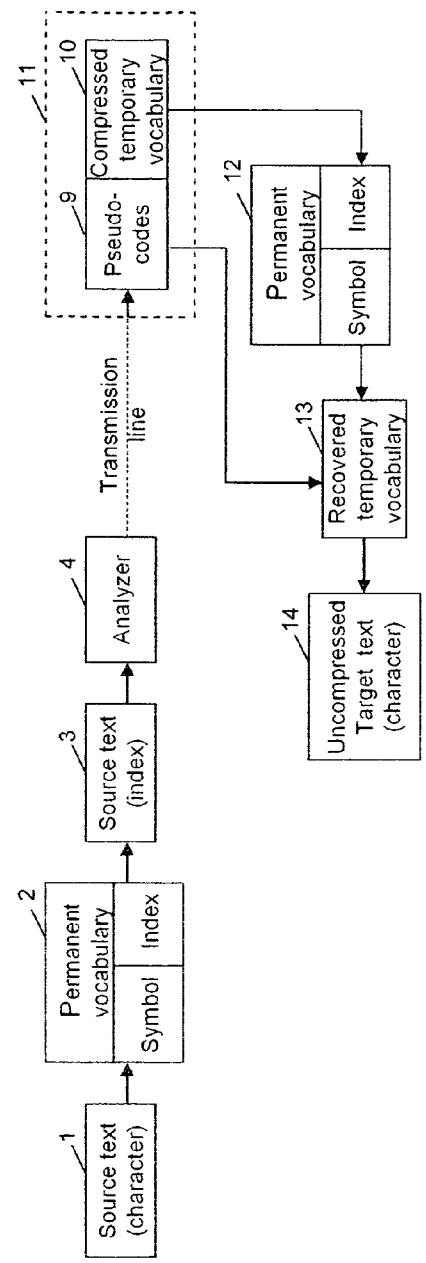
FIG. 4 illustrates flow chart of text compression on a transmitter side and text decompression on a receiver side.

FIG. 3 illustrates flow chart of text compression and decompression. Where: 1—source text in the form of characters; 2—permanent vocabulary; 3—source text in the form of indexes; 4—analyzer; 5—pseudo-codes; 6—compressed temporary vocabulary; 7—storage of compressed targeted text; 8—recovered temporary vocabulary; 9—uncompressed target text in the form of characters.

In this embodiment the process of text compression includes the following steps:
1. Converting the source text in the form of characters 1 into corresponding indexes 3 through the permanent vocabulary 2;
2. Counting repeating, none-repeating, and common indexes;
3. Temporary storing repeating, none-repeating, and common indexes;
4. Compressing high bit corresponding indexes belonging to the temporary vocabulary and then organizing these compressed indexes 6 for storing in the storage 7.
5. Making an internal recovered temporary vocabulary (not shown) which is then used to make pseudo-codes by formula $Y=C+X$;
6. Organizing pseudo-codes in the form of compressed text 5 for storing in the storage 7;

The process of text decompression includes the following steps:
1. Making the recovered temporary vocabulary 8 by process of converting the compressed indexes belonging to the temporary vocabulary 6 into high bit corresponding indexes and/or original symbols belonging to the permanent vocabulary 2.
2. Recovering pseudo-codes into indexes/symbols by the formula $X=Y-C$. The process of recovering pseudo-codes into symbols of the uncompressed Target text (character) involves the recovered temporary vocabulary 8.

In addition, the method of loading the temporary vocabulary includes steps of making the temporary vocabulary without sending loading indexes.

The method of loading the temporary vocabulary also includes the step of making a hybrid symbol (e.g. phrases) from symbols contained in the temporary vocabulary.

FIG. 1 illustrates some hybrid symbols, such as "idler shaft", "endless conveyor", armored face", "scraper chain conveyor" or phrase taken from U.S. Pat. No. 6,227,354 as "The shaft supporting assembly according to claim" (repeats 9 times).

According to the present method of text compression/decompression the present system should be a synchronized system. It means that apparatuses for compression and decompression text should use the same permanent and temporary vocabularies, commands, and algorithms.

The present method of compression text permits the fast compression process to servicing by a high frequency working computer in a computer system and low speed decompression process to servicing by a low cost frequency working computer in a computer system. The present method of compression text also permits to search a word in a compressed text without decompressing the full text. The searching process includes steps of converting a search word into an index and then searching for matching its index with index contained in the main storage of the temporary vocabulary.

What is claimed is:

1. A non-transitory computer readable media storing a program, wherein the program instructs a processor to perform the steps of a method for compressing and decompressing text, comprising:
   creating a permanent vocabulary, including high bit length indexes;
   wherein the permanent vocabulary is a redundant vocabulary including words, word combinations, and word and punctuation combinations;
   converting symbols into the corresponding high bit length indexes;
   creating a temporary vocabulary containing; creating pseudo-codes;
   arranging the pseudo-codes for storage and transmission;
   wherein creating the temporary vocabulary comprises:
   finding repeating and common symbols in a source text;
   converting the repeating and common symbols into corresponding high bit length indexes;
   compressing the high bit length indexes;
   storing or transmitting the compressed high bit length indexes;
   decompressing the stored or transmitted compressed high bit length indexes into high bit length indexes and corresponding symbols using the permanent vocabulary and the temporary vocabulary as references;
   loading the organized high bit length indexes and/or corresponding symbols into the temporary vocabulary;
   renumbering the loaded indexes;
   splitting a temporary vocabulary into two sections, which include a root of tree section and a main section;
   recovering the pseudo-codes into uncompressed target text in the form of characters.

2. The non-transitory computer readable media of claim 1, wherein creating the permanent vocabulary comprises:
   taking the symbols from thousands of books and dictionaries in advance;
   associating the symbols to their corresponding high bit length indexes;
   splitting the permanent vocabulary into various functional sections; wherein an identical permanent vocabulary is used in both compression and decompression systems.

3. The non-transitory computer readable media of claim 1, wherein converting the symbols into the corresponding high bit length indexes comprises:
   matching the symbols from a source text with those in the permanent vocabulary; and
   converting these symbols into high bit length corresponding indexes.

* * * * *